(12) United States Patent
Anazawa

(10) Patent No.: US 8,618,875 B2
(45) Date of Patent: Dec. 31, 2013

(54) USING A NEW SYNCHRONIZATION SCHEME FOR A MULTI-CHANNEL CLASS-D AMPLIFIER

(75) Inventor: Isao Ginn Anazawa, Kitchener (CA)

(73) Assignee: BlackBerry Limited, Waterloo, Ontario (CA)

( * ) Notice: Subject to any disclaimer, the term of this patent is extended or adjusted under 35 U.S.C. 154(b) by 63 days.

(21) Appl. No.: 13/330,750

(22) Filed: Dec. 20, 2011

(65) Prior Publication Data

US 2013/0154730 A1 Jun. 20, 2013

(51) Int. Cl.
*H03F 3/38* (2006.01)

(52) U.S. Cl.
USPC .......................... 330/10; 330/251; 330/207 A

(58) Field of Classification Search
USPC ........................................ 330/10, 251, 207 A
See application file for complete search history.

(56) References Cited

U.S. PATENT DOCUMENTS

| | | | |
|---|---|---|---|
| 6,429,737 B1 | 8/2002 | O'Brien | |
| 6,731,162 B2 | 5/2004 | Yeongha et al. | |
| 7,061,312 B2 | 6/2006 | Andersen et al. | |
| 7,436,254 B2 | 10/2008 | Morishima | |
| 7,459,968 B2 | 12/2008 | Ohama et al. | |
| 7,492,217 B2 * | 2/2009 | Hansen et al. | 330/10 |
| 7,580,532 B2 | 8/2009 | Seo et al. | |
| 2004/0207466 A1 | 10/2004 | Anderson et al. | |
| 2007/0252644 A1 | 11/2007 | Ohama et al. | |
| 2008/0080726 A1 | 4/2008 | Chen et al. | |

FOREIGN PATENT DOCUMENTS

| | | |
|---|---|---|
| CA | 2798943 A1 | 6/2013 |
| EP | 2608402 A1 | 6/2013 |
| JP | 2005-51289 | 2/2005 |
| JP | 2005-64972 | 3/2005 |
| WO | 2004086614 A1 | 10/2004 |

OTHER PUBLICATIONS

Extended European Search Report, European Patent Application EP 11194527.5, dated Mar. 5, 2012.
Response filed to Extended European Search Report, European Patent Application No. 11194527.5, dated Apr. 30, 2013.
Notice of Publication of European Patent Application No. 11194527.5, dated May 29, 2013.

\* cited by examiner

*Primary Examiner* — Robert Pascal
*Assistant Examiner* — Khiem Nguyen
(74) *Attorney, Agent, or Firm* — Bereskin & Parr LLP/S.E.N.C.R.L., s.r.l.

(57) ABSTRACT

Various embodiments are described herein for a multi-channel class-D amplifier and an associated processing method. In general, the multi-channel class-D amplifier comprises a signal source that provides a plurality of input signals and generates synchronization information; and a plurality of class-D amplifier channel modules, each class-D amplifier channel module being configured to process a corresponding input signal from the plurality of input signals according to the synchronization information to produce an output signal. The switching frequencies employed by the plurality of class-D amplifier channel modules are substantially similar to one another and the processing of the plurality of input signals is offset in time across the plurality of class-D amplifier channel modules.

18 Claims, 11 Drawing Sheets

USING A NEW SYNCHRONIZATION SCHEME FOR A MULTI-CHANNEL CLASS-D AMPLIFIER

FIELD

The various embodiments described herein generally relate to apparatuses and methods for multi-channel class D amplifiers to reduce the production of beat frequencies.

BACKGROUND

Class-D amplifiers are used in various applications especially when power efficiency, space efficiency, and, in some cases, cost savings are important. For example, class-D amplifiers are widely used in audio applications. A class-D amplifier amplifies and converts an input signal to a Pulse Width Modulated (PWM) signal and then converts this non-linear PWM signal to a continuous signal by low pass filtering the PWM signal. Since PWM processing in class-D amplifiers involves some switching and the use of internal clocks, having two class-D amplifiers in close proximity to one another often causes undesired frequency differences also known as beat frequencies. Beat frequencies occur when signals with two similar, but not identical, frequencies interact (e.g. "mix") which generates a beat. The generated beat frequency often falls within the audible frequency range and thus becomes audible which is problematic when the signal is produced by an audio circuit and is amplified to drive a speaker or receiver. For example, if a first class-D amplifier has a PWM frequency of 200 KHz and a second class-D amplifier has a PWM frequency of 201 KHz, and is in close proximity to the first class-D amplifier, then a beat frequency at 1 KHz (e.g. 201 KHz-200 KHz) is generated. The beat frequency problem also extends to a multi-channel class-D amplifier that has multiple channels in which beat frequencies can occur between any two of the channels. To reduce this beat frequency problem, PWM amplifiers can be implemented such that they are physically and electrically separate from one another or the exact same PWM frequency can be used for all devices. However, these solutions are not necessarily feasible in practice.

BRIEF DESCRIPTION OF THE DRAWINGS

For a better understanding of the various embodiments described herein, and to show more clearly how these various embodiments may be carried into effect, reference will now be made, by way of example, to the accompanying drawings which show at least one example embodiment, and in which:

FIGS. 7E-1, 7E-2, 7E-3 shows examples of clock, frame and synchronization signals that can be extracted from another example coded synchronization signal that can be used with the multi-channel class-D amplifier of FIG. 7A;

DETAILED DESCRIPTION OF THE EMBODIMENTS

Figure 1:
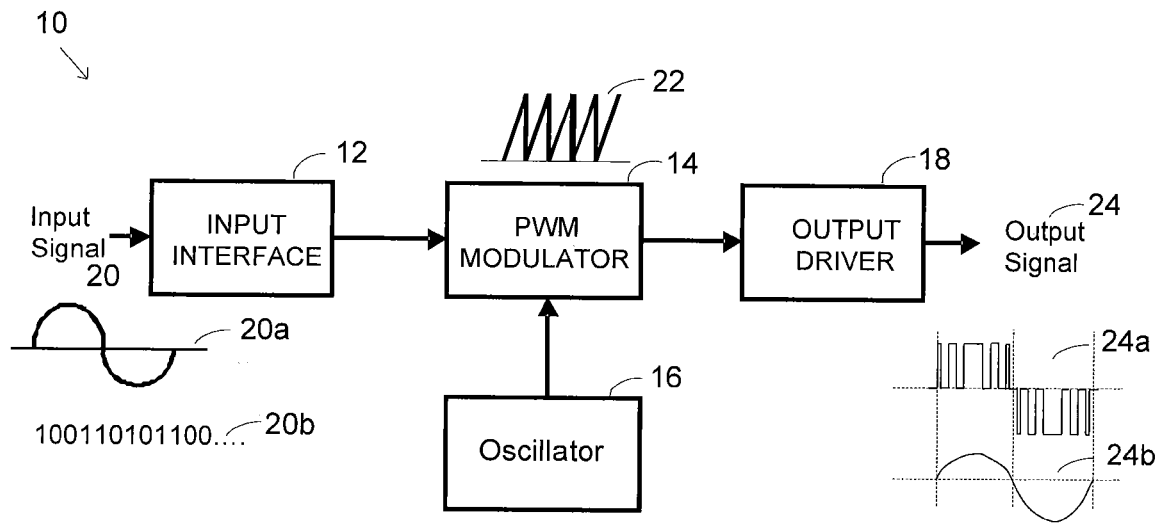
FIG. 1 is a block diagram of a class-D amplifier.

Various apparatuses or processes will be described below to provide example embodiments of each claimed invention. No embodiment described below limits any claimed invention and any claimed invention may cover processes or apparatuses that differ from those described below. The claimed inventions are not limited to apparatuses or processes having all of the features of any one apparatus or process described below or to features common to multiple or all of the apparatuses or processes described below. It is possible that an apparatus or process described below is not an embodiment of any claimed invention. Any invention disclosed in an apparatus or process described below that is not claimed in this document may be the subject matter of another protective instrument, for example, a continuing patent application, and the applicants, inventors or owners do not intend to abandon, disclaim or dedicate to the public any such invention by its disclosure in this document.

It will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein.

The embodiments described herein generally relate to hardware and circuitry as well as associated methods that are used to reduce beat frequencies for both digital and analog multi-channel class-D amplifiers. Beat frequencies result from the frequency difference between the switching frequencies used by the Pulse Width Modulation (PWM) oscillators in each of the channels of a multi-channel class-D amplifier. The beat frequencies can fall in the audio frequency band which is undesirable for audio signal processing applications. The techniques described herein generally relate to the use of multi-phase clocks and/or synchronization signals such that the same switching frequencies are used in each channel but are slightly offset from one another in time thereby offsetting the processing in each channel in order to reduce beat frequencies as well as to reduce peak power consumption as the power demand will be spread or shifted across time for each of the class-D amplifier channels. The term "multi-channel" means that there are multiple class-D amplifier channels which can be included in one or more IC packages or in discrete analog or digital components. The embodiments described herein can be used for audio applications, motor control applications, large LED display applications, very bright LED display applications, ultrasonic (e.g. piezo) transducer driver applications and more generally in applications that utilize multiple channels of class-D amplifiers. A large or bright LED display uses a significant amount of current (in other words energy) and it will be more energy efficient to use a PWM-based method to control LED brightness.

Referring now to FIG. 1, shown therein is a block diagram of a conventional class-D amplifier 10. The class-D amplifier 10 comprises an input interface 12, a PWM modulator 14, an oscillator 16, and an output driver 18. The input interface 12 may include pre-amplification and pre-filtering circuitry and as well as a Digital to Analog (D/A) converter in the case of digital input signals. The PWM modulator 14 includes circuitry, as is known by those skilled in the art, which uses a timing signal generated by the oscillator 16 to generate a pulse modulated signal based on its input. The oscillator 16 can be a Phase Lock Loop (PLL) or other suitable oscillation circuit. The output driver 18 typically comprises amplification circuitry to amplify the output of the PWM modulator 14. Typically, a minimum amount of low pass filtering is used and can be included in the output driver 24.

More particularly, the class-D amplifier 10 amplifies and converts an input signal 20 to a PWM-modulated signal, which is non-linear, and then converts this non-linear signal to an output signal 24, which can be considered to be a quasi-analog signal. The input signal 20 can be an analog signal 20a or a digital signal 20b (in the analog case, a D/A converter is not necessarily required in the input interface 12). The oscillator 16 generates a semi-constant clock signal that is used by the PWM modular 14 to produce a time window for generating a triangle signal 22. A comparator within the PWM modulator 14 compares the input signal 20 and the signal 22 in order to produce the PWM signal which is a digital logic signal that has 0's or 1's. A value of 1 is produced in the PWM signal when the input signal 20 has a larger magnitude than the triangle signal 22 and a value of 0 is produced when the input signal 20 has a smaller magnitude than the triangle signal 22. The output driver 18 amplifies the PWM signal, generated by the PWM modulator 14, to a desired amplitude in the output signal 24. The signal 24a is an example of the output signal 24 in cases where the output driver 18 does not employ any filtering or prior to filtering. The signal 24b is an example of the output signal 24 in cases where the output driver 18 employs some filtering. In either case, the output signal 24 can then be processed by filtering circuitry (not shown) having a certain pass-band that is selected based on the application for which the class-D amplifier 10 is being used. For example, in audio applications, the output signal 24 will typically be low pass filtered in a frequency range that generally corresponds to the human audible frequency range.

In the class-D amplifier 10, most, if not all, of the functions are normally implemented using hardware. However, for the more elaborate embodiments which follow, some of the functions can be implemented using a Digital Signal Processor (DSP) along with appropriately designed firmware (i.e. DSP software).

Figure 2A:
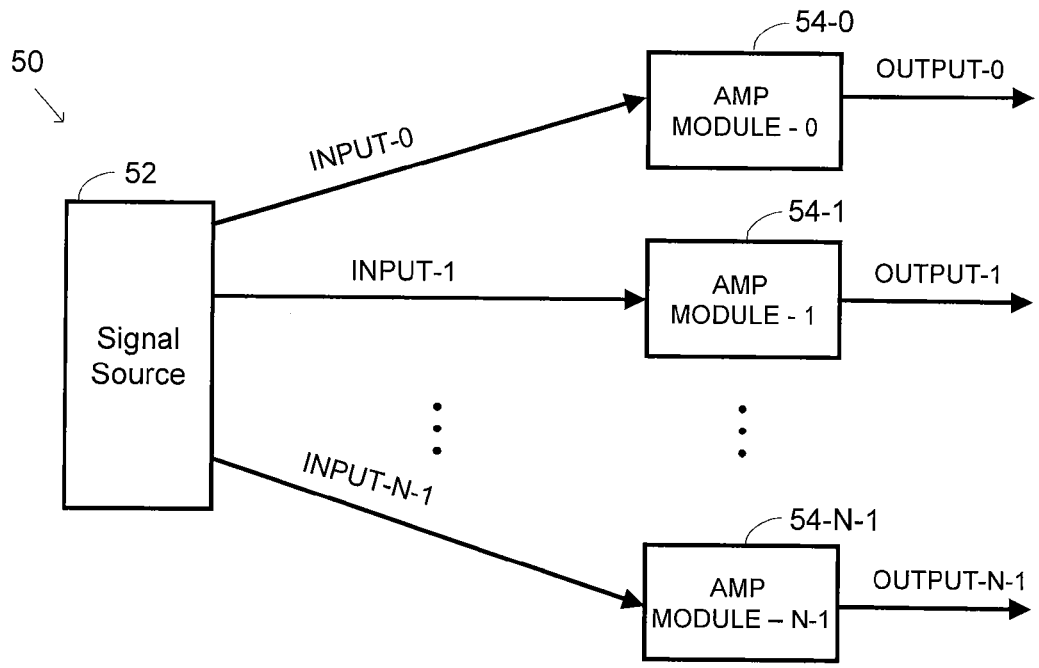
FIG. 2A is a block diagram of a multi-channel class-D amplifier.

Referring now to FIG. 2A, shown therein is a block diagram of a multi-channel class-D amplifier 50. The multi-channel class-D amplifier 50 has N amplifier channel modules 54-0 to 54-N−1 that process N input signals INPUT-0 to INPUT-N−1 to produce N output signals OUTPUT-0 to OUTPUT-N−1. The N input signals are provided by a signal source 52 (generally, with regards to all signal sources described herein, the usage of the word provides is meant to cover cases in which the signal sources generate the N input signals and other cases in which the signal sources receive the N input signals and send them to the amplifier channel modules). The implementation of the signal source 52, and other signal sources discussed herein, depends on the application of the multi-channel class-D amplifier 50. For example, for audio applications, the signal source 52 could be a multi-channel home-theatre system such as a 6 channel (Dolby 5.1) system (alternatively, fewer or more channels could be used), a tablet computing device or a handheld device that is designed to playback a multi-channel source such as Dolby 5.1. It should be noted that a handheld device is a device that is sized and shaped to be held or carried in a human hand. In motor control applications, the signal source 52 can be a control system that generates several control signals to control several motors (e.g. industrial/consumer robot products use several motors and require several control signals). Each of the class-D amplifier channel modules 54-0 to 54-N−1 has a similar structure to that shown for the class-D amplifier 10. A power source 60 (see FIG. 2B) can also be used which would be a separate power supply or a voltage bus as the case may be. For example, for DC power, the power source 60 can be a battery or a regulated/non-regulated DC power source.

When a system contains more than one class-D amplifier and places them in close proximity to one another, as in the case of the multi-channel class-D amplifier 50, due to the use of switching to implement PWM, each class D-amplifier channel emits a signal at their oscillator's frequency. When these oscillators are oscillating at different frequencies then the beat effect occurs in which beat frequencies equal to the difference in the switching frequency are produced, which can appear as undesired noise in the output.

Figure 2B:
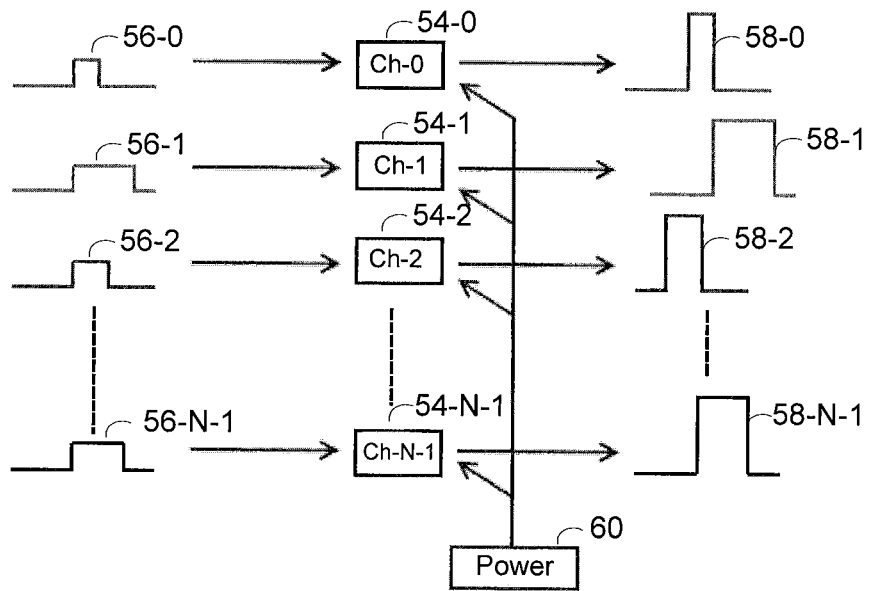
FIG. 2B is an example of output signals produced when certain input signals are processed by the multi-channel class-D amplifier of FIG. 2A.

Referring now to FIG. 2B, shown therein is an example of output signals 58-0 to 58-N−1 that are produced when input signals 56-0 to 56-N−1 are processed by the amplifier channel modules 54-0 to 54-N−1 of the multi-channel class-D amplifier 50. It can be seen that although the starting position of the input signals 56-0 to 56-N−1 are aligned in time, the resulting output signals 58-0 to 58-N−1 are not necessarily aligned in time due to the use of independent oscillator circuits 16 in each of the class-D amplifier channels. Furthermore, the use of independent, but similarly designed, oscillators cause each channel's PWM switching frequency to be close to each other but not exactly the same which is the main cause of the beat frequency phenomenon.

Figure 3A:
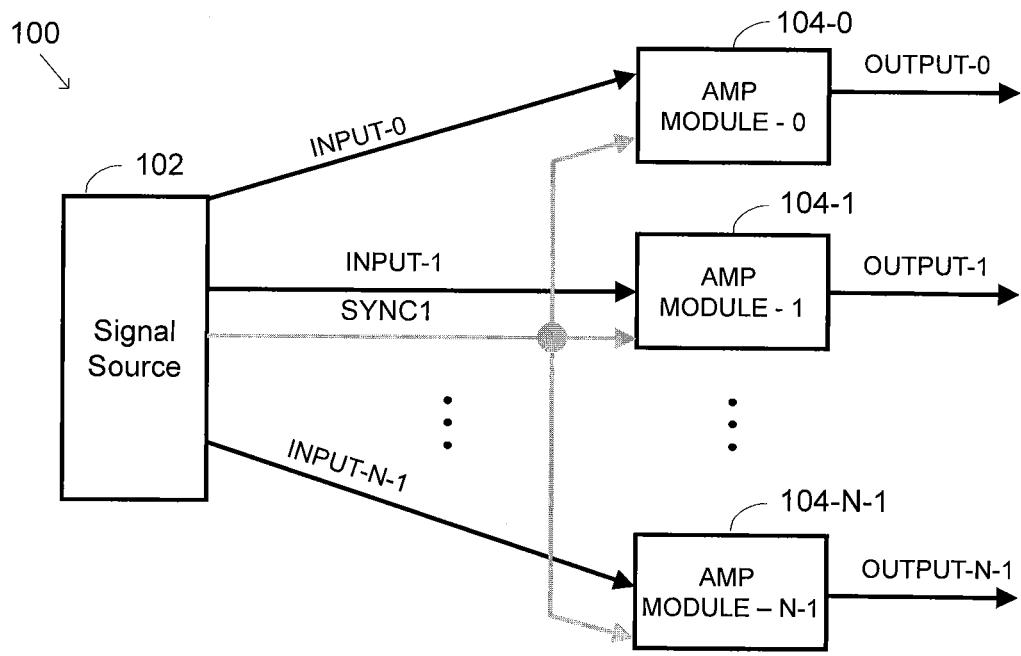
FIG. 3A is a block diagram of an example embodiment of a multi-channel class-D amplifier that uses a sync signal to synchronize the processing of the input channel signals.

Referring now to FIG. 3A, shown therein is a block diagram of a multi-channel class-D amplifier 100 that uses a sync signal to synchronize the processing of the input channel signals. The multi-channel class-D amplifier 100 has a similar structure to the multi-channel class-D amplifier 50 except that each class-D amplifier channel module 104-0 to 104-N−1 now has an additional input to receive a synchronization signal SYNC1 so that processing in each of the channels can be synchronized with one another. The signal source 102 includes a synchronization (SYNC) source 110 that generates and provides the synchronization signal SYNC1 as an input to each of the oscillators of the class-D amplifier channels 104-0 to 104-N−1. The SYNC source 110 can be implemented using a variety of elements such as a system clock, a dedicated crystal oscillator, a self-oscillator of desired frequency and the like. The synchronization signal SYNC1 synchronizes each of the oscillators that drive the PWM modulators in each of the channels to reduce the production of any undesirable beat signals by the multi-channel class-D amplifier 100.

Figure 3B:
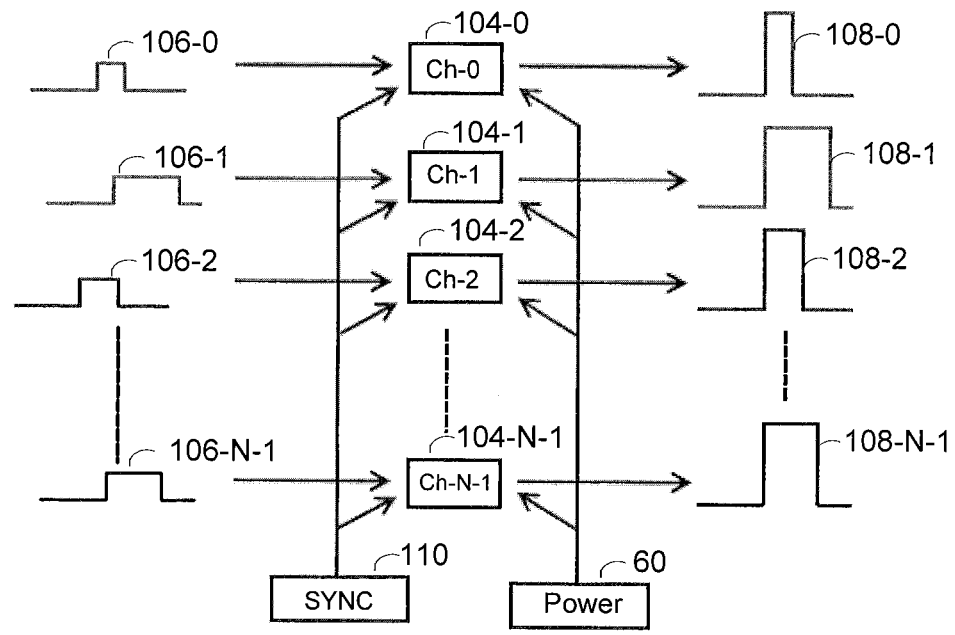
FIG. 3B is an example of output signals produced when certain input signals are processed by the multi-channel class-D amplifier of FIG. 3A.
Figure 3C:
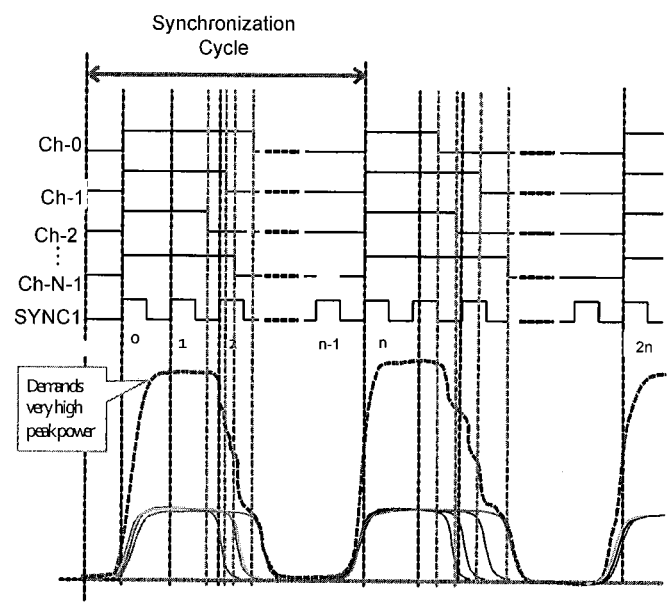
FIG. 3C is a diagram showing timing for channel processing and the resulting power consumption by the multi-channel class-D amplifier of FIG. 3A.

Referring now to FIG. 3B, shown therein is an example of output signals 108-0 to 108-N−1 that are produced when input signals 106-0 to 106-N−1 are processed by the multi-channel class-D amplifier 100. In this case, the use of the synchronization signal SYNC1 not only reduces the generation of beat frequencies but it also synchronizes processing in each of the channels 104-0 to 104-N−1 such that the starting point of the output signals 108-0 to 108-N−1 are lined up in time. An example of the synchronization signal SYNC1 and peak power demand is shown in FIG. 3C. On the rising edge of the first pulse in the synchronization signal SYNC1, the power drivers in each of the amplifier channels 104-0 to 104-N−1 turn on and the input signals are processed. The power drivers in each of the amplifier channels 104-0 to 104-N−1 then turn on again at the $N^{th}$ pulse, then again at the $2*N^{th}$ pulse, the $3*N^{th}$ pulse and so on. The "on duration" of each of the amplifier channels 104-0 to 104-N−1 is entirely dependent on the magnitude of the input signals 106-0 to 106-N−1 and is the direct result of PWM modulation. The waveforms in FIG. 3C simulate a real application assuming that the input signals INPUT-0 to INPUT-N−1 to each amplifier channel 104-0 to 104-N−1 are different from each other. The signals shown for the amplifier channels 104-0 to 104-N−1 represent pulse width modulated output signals. However, this results in a very high peak power demand since the circuitry in each of the amplifier channels 104-0 to 104-N−1 are operational at the same time and the power drivers turn on at the same time. Furthermore, this high peak power demand is most likely not compatible with many battery operated systems.

Figure 4A:
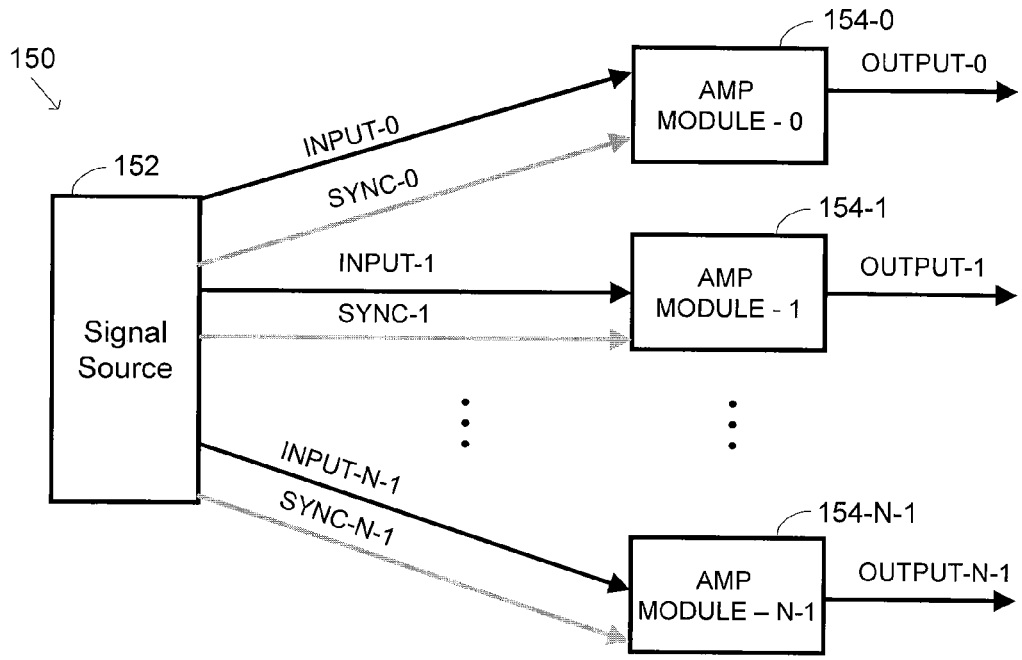
FIG. 4A is a block diagram of an example embodiment of a multi-channel class-D amplifier that uses a sync signal for each channel.

Referring now to FIG. 4A, shown therein is a block diagram of an example embodiment of a multi-channel class-D amplifier 150 that uses a different synchronization signal for each channel. The signal source 152 provides a plurality of input signals INPUT-0 to INPUT-N−1 and generates synchronization information in the form of synchronization signals SYNC-0 to SYNC-N−1 thereby implementing a multi-phase clock. Each class-D amplifier channel module 154-0 to 154-N−1 is configured to process a corresponding input signal from the plurality of input signals according to the synchronization information to produce corresponding output signals OUTPUT-0 to OUTPUT-N−1. The synchronization information comprises information for switching frequencies and processing offsets. The switching frequencies employed by the plurality of class-D amplifier channel modules 154-0 to 154-N−1 are substantially similar to one another and the processing of the plurality of input signals is offset in time across the plurality of class-D amplifier channel modules 154-0 to 154-N−1.

The synchronization signal SYNC-0 can be derived from a high frequency master synchronization signal by dividing it by N. Likewise, the synchronization signal SYNC-1 can be derived by dividing the high frequency master synchronization signal by N and shifting it by one clock synchronization cycle. The remaining synchronization signals can be produced in a similar fashion. The multi-phase clock is used to address the high peak power demand problem that was shown in FIG. 3C by causing each class-D amplifier channel module 154-0 to 154-N−1 to turn on and off at slightly different times based on the timing specified by the multi-phase clock. This technique is suitable for an analog implementation of the multi-channel class-D amplifier 150. A technique suitable for a digital implementation of a multi-channel class-D amplifier is described with respect to FIG. 5.

Figure 4B:
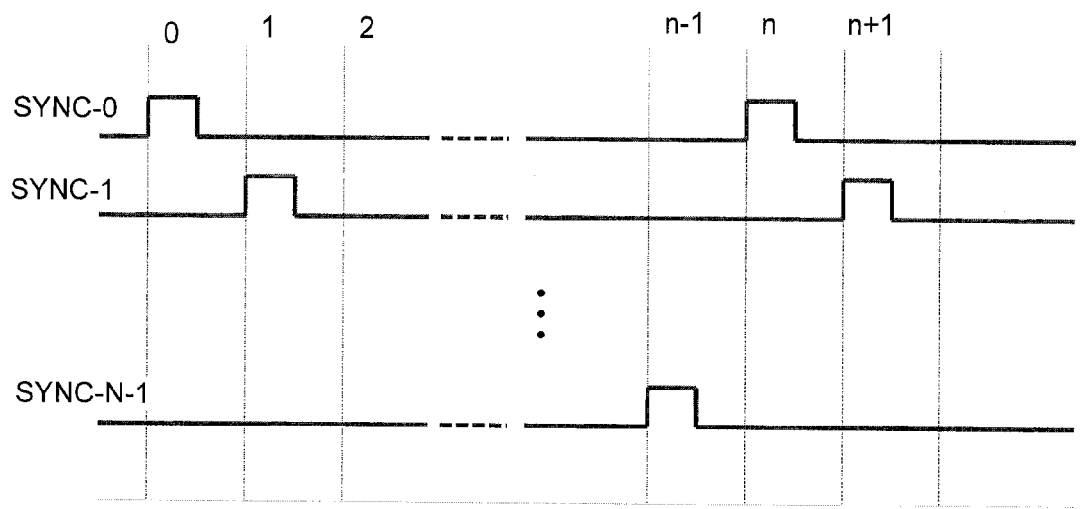
FIG. 4B shows an example of sync signals that can be used by the multi-channel class-D amplifier of FIG. 4A for the case of N channels.

Referring now to FIG. 4B, shown therein is an example of sync signals SYNC-0 to SYNC-N−1 that can be used by the multi-channel class-D amplifier 150 to reduce the generation of beat frequencies during operation. The synchronization signals SYNC-0 to SYNC-N−1 have pulses that are offset with respect to one another in time and each of the synchronization signals SYNC-0 to SYNC-N−1 are sent to a unique class-D amplifier channel module to offset the processing of each class-D amplifier channel module in time. In this case, the amount of offset for a given class-D amplifier channel module corresponds to a channel identifier of the given class-D amplifier channel module. In this example, each sync signal has a duration of Td seconds and the sync signals SYNC-0 to SYNC-N−1 are offset from one another by Td*N seconds where N is the number of channels in the multi-channel class-D amplifier 150. The spacing of Td*N for a current synchronization cycle is the time given to each class-D amplifier channel 154-0 to 154-N−1 to produce the proper time for it to "turn on", process its input, and produce its output from its PWM modulator within a given synchronization cycle (e.g. frame) so that all of the data in the given frame can be processed before processing the data associated with the next frame. In other words, the synchronization signal that turns on a given class-D amplifier channel 154-0 to 154-N−1 occurs every Td*N seconds. The overall on time for each class-D amplifier channel 154-0 to 154-N−1 during a synchronization cycle is proportional to the magnitude of its corresponding input signal and the time at which each class-D amplifier channel 154-0 to 154-N−1 starts to "turn on" to process its input is offset by Td amongst consecutive amplifier channels.

Figure 4C:
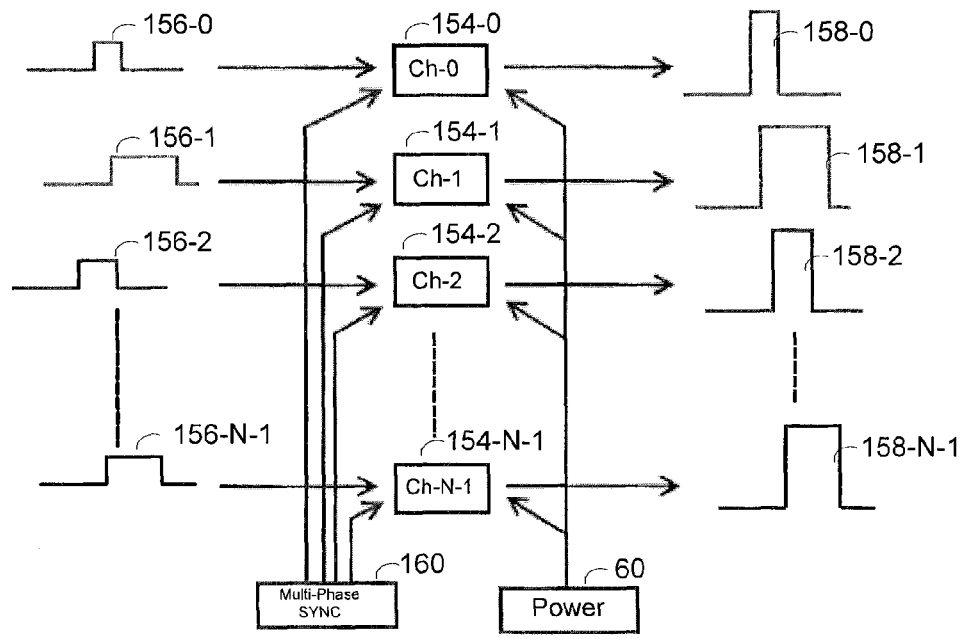
FIG. 4C is an example of output signals produced from input signals by the multi-channel class-D amplifier of FIG. 4A.

Referring now to FIG. 4C, shown therein is an example of output signals 158-0 to 158-N−1 that are produced when input signals 156-0 to 156-N−1 are processed by the multi-channel class-D amplifier 150. In this case, the signal source 152 includes a multi-phase sync source 160 that generates synchronization signals SYNC-0 to SYNC-N−1 to reduce the generation of beat frequencies and also offset the processing in each of the class-D amplifier channels 154-0 to 154-N−1 such that the output signals 158-0 to 158-N−1 are slightly offset in time. The synchronization signals SYNC-0 to SYNC-N−1 can be generated as previously explained, which may be implemented using a combination of logic circuitry, such as counters, shifters, multiplexers and the like. The slight offset in the output signals 158-0 to 158-N−1 is insignificant in terms of affecting signal quality for relatively low frequency input signals (e.g. on the order of approximately 20 Hz to 20 KHz) since the SYNC signals are normally in the range of several hundred KHz or higher. In cases where the timing offset in the output signals 158-0 to 158-N−1 becomes significant for the quality of the overall output signal, then this offset can be reduced at the signal source 152 by applying an appropriate amount of delay to the input signals 156-0 to 156-N−1 while still ensuring that there is a sufficient amount of offset in the channel processing so that the peak processing power demand is not too high.

Figure 4D:
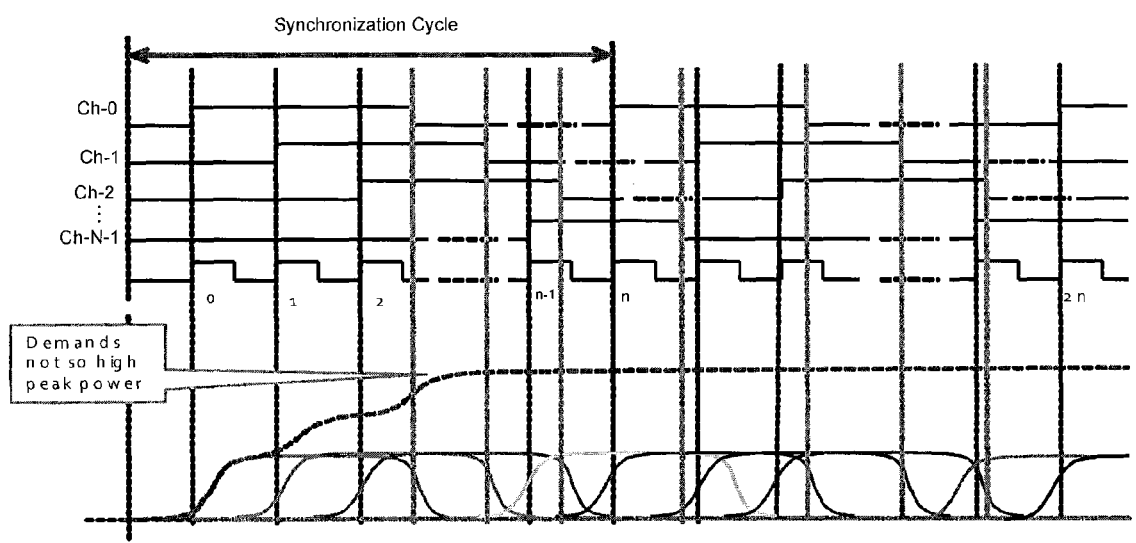
FIG. 4D is a diagram showing timing for channel processing and the resulting power consumption by the multi-channel class-D amplifier of FIG. 4A.

An example of the synchronization and peak power demand is shown in FIG. 4D. The offset in processing for each of the class-D amplifier channels 154-0 to 154-N−1 allows the power consumption (also known as power demand) of these channels to be spread out over time so that the peak power is not as high as it was (see FIG. 3C) for the multi-channel class-D amplifier 100. Again, each class-D amplifier channel 154-0 to 154-N−1 is operational long enough to process its corresponding input signal, which depends on the magnitude of the input signal. The final signal in FIG. 4D is a superposition of the sync signals SYNC-0 to SYNC-N−1 and can be thought of as the master synchronization signal which shows the time that each of the amplifier channels 158-0 to 158-N−1 are turned on. The processing in each amplifier channel 154-0 to 154-N−1 begins with the rising edge of corresponding pulse.

Figure 5:
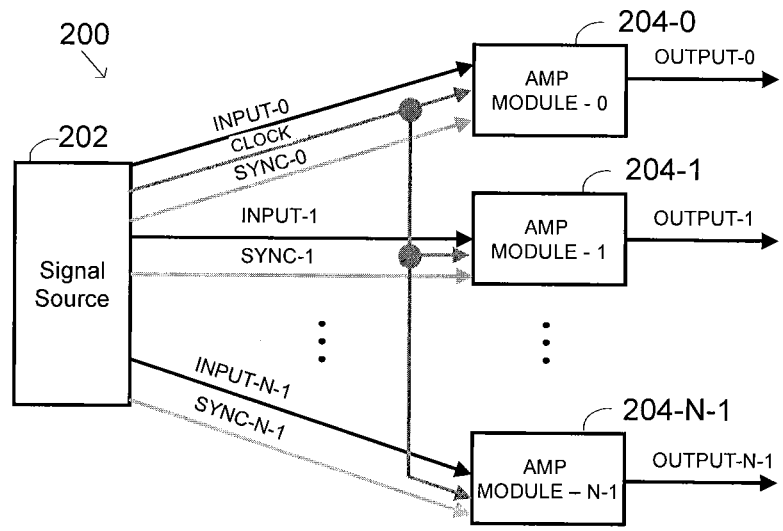
FIG. 5 is a block diagram of an example embodiment of a multi-channel class-D amplifier that uses a sync signal and a clock signal for each channel.

Referring now to FIG. 5, shown therein is a block diagram of another example embodiment of a multi-channel class-D amplifier 200 that uses a synchronization signal for each channel. The multi-channel class-D amplifier 200 is the digital version of the multi-channel class-D amplifier 150. In this case, the signal source 202 generates a plurality of synchronization signals SYNC-0 to SYNC-N−1 and a clock signal. One of the synchronization signals SYNC-0 to SYNC-N−1 and the clock signal are sent to each channel 204-0 to 204-N−1 of the multi-channel class-D amplifier 150 thereby also implementing a multi-phase clock to address the high peak power demand problem and to reduce the production of beat frequencies. The clock signal is used mainly for latching in order to allow the input signals to be received in the corresponding class-D amplifier channels 204-0 to 204-N−1 at the proper time. However, there can be alternative embodiments which incorporate a single wire (e.g. without a clock signal) or an "input signal only system" that is able to retrieve clock information from the input signal by using circuitry. It should be noted that FIGS. 4B-4D also apply to the multi-channel class-D amplifier 200.

Figure 6A:
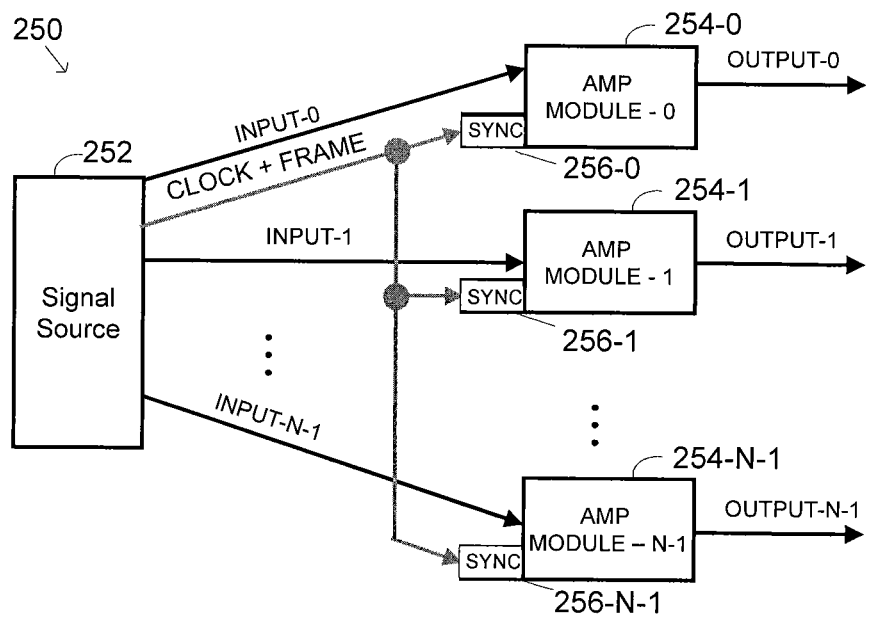
FIG. 6A is a block diagram of an example embodiment of a multi-channel class-D amplifier with clock and frame signals used to synchronize processing for each channel.

Referring now to FIG. 6A, shown therein is a block diagram of an example embodiment of a multi-channel class-D amplifier 250 that uses clock and frame signals to synchronize the processing of the various amplifier channels. The multi-channel class-D amplifier 250 comprises a signal source 252, a plurality of class-D amplifier channel modules 254-0 to 254-N−1 and a plurality of corresponding synchronization (sync) modules 256-0 to 256-N−1. The signal source 252 provides a plurality of input signals INPUT-0 to INPUT-N−1 as well as a clock signal and frame signal. The signal source 252 can incorporate a combination of logic circuits, such as counters, shifters, multiplexers and the like. The implementation of the portion of the signal source 250 that produces the clock and frame signals would be similar to the schematic shown in FIG. 7C except without the ID code generator 312 and the CRC generator 314. Each class-D amplifier channel module 254-0 to 254-N−1 receives a corresponding input signal INPUT-0 to INPUT-N−1 and each sync module 256-0 to 256-N−1 receives the clock signal and the frame signal (also known as a frame information embedded clock signal). The use of a clock signal and a frame signal reduces the number of wires needed for synchronization to two. Each class-D amplifier channel module 254-0 to 254-N−1 processes a corresponding input signal INPUT-0 to INPUT-N−1 according to the timing specified in the clock and frame signals such that the processing in each of the channels is synchronized based on clock frequency to reduce the production of beat frequencies and such that the processing in each of the channels is slightly offset in time to reduce the peak power demand.

The sync modules 256-0 to 256-N−1 are configured to synchronize the processing of their corresponding class-D amplifier channel modules 254-0 to 254-N−1 according to the synchronization information. The sync modules 256-0 to 256-N−1 act as decoders to generate a synchronization signal from the clock signal and the frame signal for the corresponding class-D amplifier channel 254-0 to 254-N−1. The decoding or extracting of frame information from an embedded clock signal (e.g. clock and frame signals) can be done by using a combination of logic circuits. For example, there in cases in which the Sony Philips Digital Interface (SPDIF) signal format is used, a single wire is used to carry the input signal, the clock signal and the frame signal, as well as other meta-data, and thus decoding can be performed by using a PLL to extract the clock signal. The clock signal can then be used to extract the data, the meta-data, and the other required components by following a scheme related to the predefined order of data (according to the SPDIF format). This circuitry/methodology that would be employed is similar to that shown in FIG. 7D. Alternatively, there can be cases in which the Audio Engineering Society/European Broadcast Union (AES/EBU) signal format is used, which is similar to the SPDIF format, and can be decoded in a similar fashion. Alternatives for the PLL block described in FIG. 7D, that can be used in the sync modules 256-0 to 256-N−1, include a digital PLL, digital synthesizer or a Variable Crystal Oscillator (VCXO).

Figure 6B:
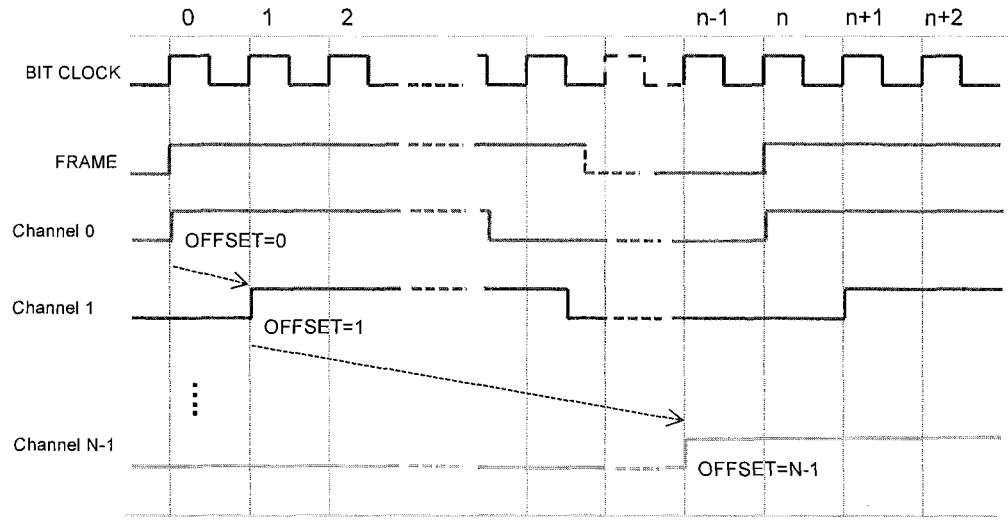
FIG. 6B shows an example of sync signals that can be used by the multi-channel class-D amplifier of FIG. 6A.

Regardless of the particular format that is used for the clock and frame signals, the clock signal can generally be considered to be a bit clock signal and has a frequency that is higher than the frame signal. An example relationship among the signals used for synchronization is that the bit clock signal can have a frequency of about 64×Fs Hz, and the frame signal can have a frequency of about Fs Hz. The variable Fs stands for sampling frequency which may be on the order of 48 kHz but may be 32 kHz or 44.1 kHz in alternative embodiments. Generally, upon a rising edge in the frame signal, the sync modules 256-0 to 256-N−1 are configured to identify a corresponding pulse in the clock signal that indicates that the class-D amplifier channel module 254-0 to 254-N−1 that corresponds to the sync module 256-0 to 256-N−1 is to start processing the corresponding input signal INPUT-0 to INPUT-N−1. In this example, the rising edge of the frame signal is used as a trigger for each sync module 256-0 to 256-N−1 to start counting an offset value by counting the number of pulses in the clock signal. Each sync module 256-0 to 256-N−1 is assigned an offset or count and when that offset occurs for a given sync module based on the count of the bit clock signal, processing in the class-D amplifier channel module that is associated with the given sync module is started. For example, the sync module 256-0 can be assigned an offset of 0 so that when the rising edge of the frame signal occurs on the first rising edge of the bit clock signal, the class-D amplifier channel 254-0 begins to process the input signal INPUT-0. Likewise, the sync module 256-1 can be assigned an offset of 1 so that after the rising edge of the frame signal has occurred and on the second rising edge of the bit clock, the class-D amplifier channel 254-1 begins to process the input signal INPUT-1 and so on and so forth. An example of this operation is shown in FIG. 6B which shows the processing times for amplifier channels 0, 1 and N−1. The frame signal can be at a high logic level for J periods and then at a low logic level for K periods. The value of J does not necessarily have to be equal to the value of K although there may be cases where J does equal K. It should be noted that the example of FIG. 4D would also apply to the multi-channel class-D amplifier 250. As can be seen, every amplifier channel module 254-0 to 254-N−1 receives only one rising edge of the bit clock signal as a synchronization signal in a given frame cycle (defined by the frame signal having a high logic value followed by a low logic value) and the processing in subsequent amplifier channel modules in this example is offset by one clock cycle. However, there can be other embodiments in which the processing of subsequent amplifier channel modules is offset by more than one cycle. The difference in synchronization between subsequent amplifier channel modules results in a processing offset to reduce peak power demand.

Figure 7A:
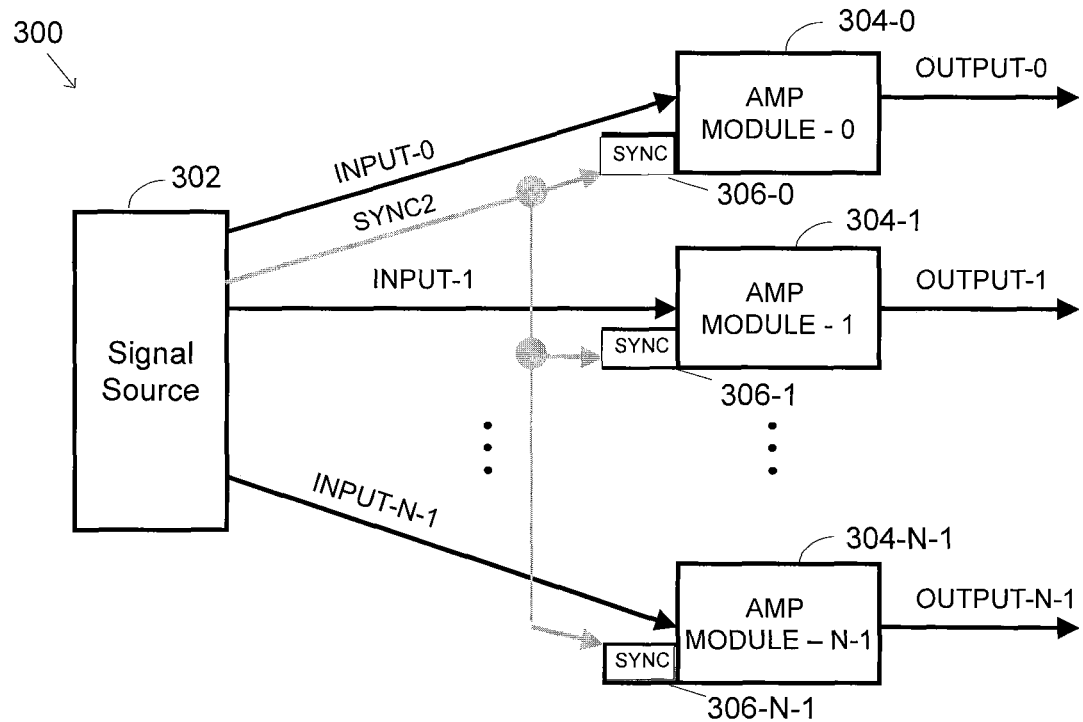
FIG. 7A is a block diagram of an example embodiment of a multi-channel class-D amplifier with a coded sync signal used to synchronize processing for each channel.

Referring now to FIG. 7A, shown therein is a block diagram of an example embodiment of a multi-channel class-D amplifier 300 with a coded synchronization signal SYNC2 that is used to synchronize processing for each channel. The multi-channel class-D amplifier 300 comprises a signal source 302, a plurality of class-D amplifier channel modules 304-0 to 304-N−1 and a plurality of corresponding sync modules 306-0 to 306-N−1. The signal source 302 provides a plurality of input signals INPUT-0 to INPUT-N−1 and generates the coded synchronization signal SYNC2. Each class-D amplifier channel module 304-0 to 304-N−1 receives a corresponding input signal INPUT-0 to INPUT-N−1 and each sync module 306-0 to 306-N−1 receives the synchronization signal SYNC2. Each class-D amplifier channel module 304-0 to 304-N−1 processes the corresponding input signal INPUT-0 to INPUT-N−1 according to the timing specified in the synchronization signal SYNC2 such that the processing in each of the channels is synchronized in switching frequency to reduce the production of beat frequencies and such that the processing in each of the channels is slightly offset in time to reduce the peak power demand.

The coded synchronization signal SYNC2 includes a clock portion with clock pulses and a coded portion that acts as a channel synchronization portion and is interspersed amongst the clock pulses. Each coded portion corresponds to one of the amplifier channels (i.e. each class-D amplifier channel module 304-0 to 304-N−1). The sync modules 306-0 to 306-N−1 are configured to identify a corresponding coded portion in the coded synchronization signal SYNC2 that indicates that the class-D amplifier channel module 304-0 to 304-N−1 that corresponds to the synchronization module 306-0 to 306-N−1 is to start processing the corresponding input signal INPUT-0 to INPUT-N−1. In at least some embodiments, the coded portion can be considered to be a modulated signal that includes a unique code for each amplifier channel 304-0 to 304-N−1. The clock portion can be used to determine the switching frequency of the oscillator used by the given amplifier channel. Accordingly, the series of clock pulses that follow the coded portions are used to ensure substantially similar switching for each of the class-D amplifier channel modules 304-0 to 304-N−1.

Figure 7B:
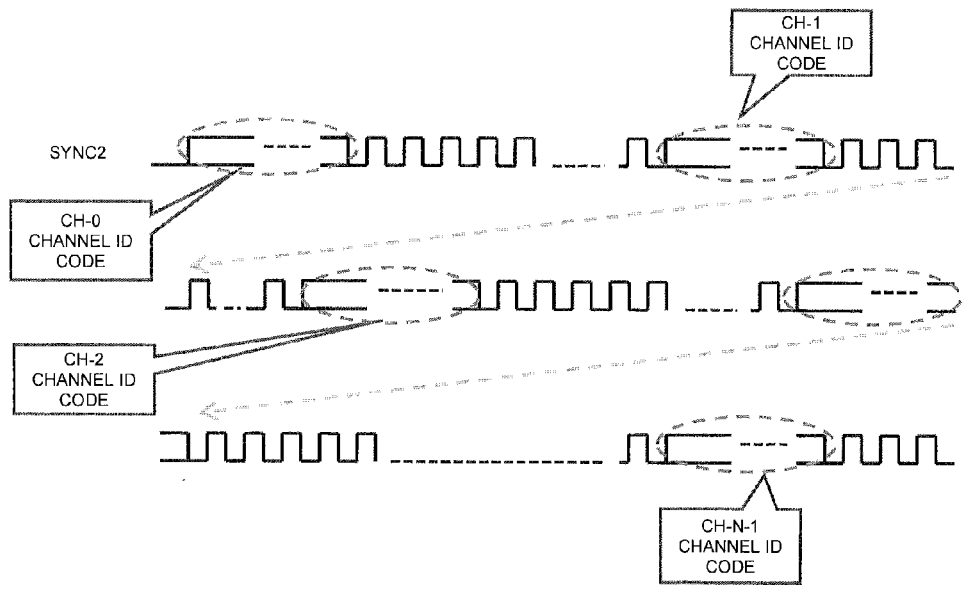
FIG. 7B shows an example of a coded synchronization signal that can be used with the multi-channel class-D amplifier of FIG. 7A.

One example embodiment of the synchronization signal SYNC2 that can be used with the multi-channel class-D amplifier 300 is shown in FIG. 7B. The synchronization signal SYNC2 comprises a coded portion CH-0 channel ID code followed by a series of clock pulses, then a coded portion CH-1 channel ID code followed by a series of clock pulses and so on and so forth until the coded portion CH-N−1 channel ID code followed by a series of clock pulses. This sequence then repeats again for as long as the multi-channel class-D amplifier 300 is processing input signals. The coded portion of the synchronization signal SYNC2 can be coded to be any identifiable coded waveform as long as it can fit between the pulses that are required for channel processing in the synchronization signal SYNC2. For example, the coded portion of the coded synchronization signal SYNC2 can include quasi-random signals. Furthermore, the coded portion can be shorter than the steady clock period with an added margin of safety. In FIG. 7B, the synchronization signals used by the amplifier channel modules 304-0 to 304-N−1 are directly encoded in the coded synchronization signal SYNC2 so that separate frame signals are not needed. It is recommended that the clock signal be at least (N+M) times higher than the system shown in FIG. 4C where M is bit length for channel ID code. In general, the coded portion can be long enough to separately include an embedded code or a frame signal plus an ID code, as will be described in further detail below.

Figure 7C:
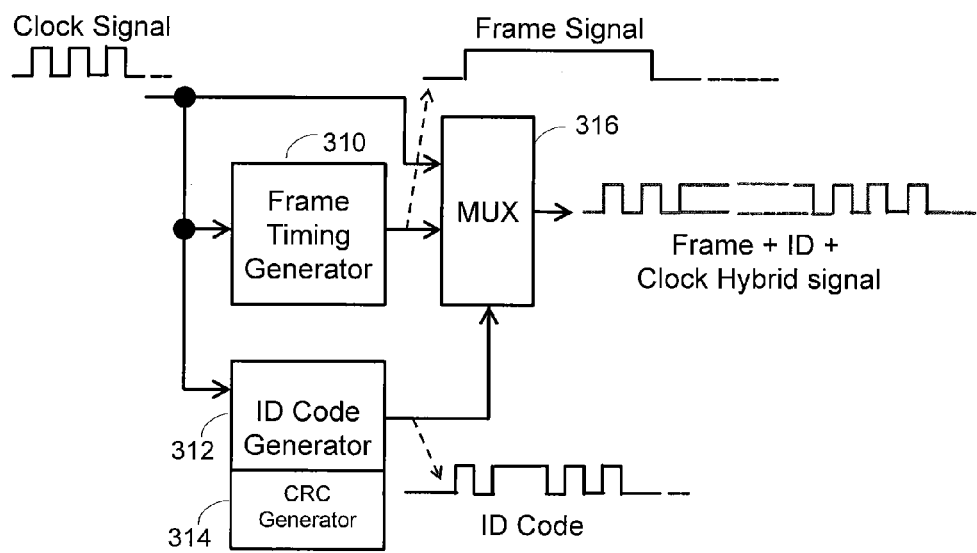
FIG. 7C shows a block diagram of a portion of a signal source that can be used to generate synchronization information for the multi-channel class-D amplifier of FIG. 7A.

An example embodiment of a portion of a signal source that can be used to provide synchronization information including frame information for the multi-channel class-D amplifier 300 is shown in FIG. 7C. The input signals INPUT-0 to INPUT-N−1 are not shown in FIG. 7C but it is understood by those skilled in the art that these signals are provided to the signal source 302 which then provides them to the amplifier channel modules 304-0 to 304-N−1. The portion of the signal source comprises a frame timing generator 310, an ID code generator 312, a Cyclic Redundancy Check (CRC) generator 314 and a multiplexer (MUX) 316. The frame timing generator 310 generates the frame signal from the clock signal by using a combination of counters with a predetermined bit length to implement the required timing for channel processing of the multi-channel class-D amplifier 300 for a given frame cycle. The ID code generator 312 generates a unique code for each amplifier channel module 304-0 to 304-N−1. For example, the ID code generator 312 (which can be implemented in software) can combine a simple channel numbering with a pseudo random code, which can be generated by using a quasi-random sequence such as M series random codes or M series logic. In other embodiments, Lehmer codes or Mersenne Twister codes can be used. Other pseudo-random bit patterns can also be used as long as they are embedded at predefined intervals in the synchronization signal and are known to the synchronization modules 306-0 to 306-N−1. For instance, 4 bit, 16 bit, 32 bit or 64 bit patterns can be used (with the larger bit patterns providing increased code reading reliability). An example of a 4 bit random code system could be: code1=0011, code2=0100, code3=1001, . . . , code14=1101 and code15=1011. Using a more complicated bit pattern for the codes will increase the speed of finding the code and increase reliability. For transmission reliability, an error check code generated by a bit error management scheme, such as the Cyclic Redundancy Check (CRC) scheme generated by the CRC generator 314, can be added to the data stream generated by the ID code generator 312 to produce the ID code. In a more general embodiment, an error check block can be used in place of the CRC generator 314 to generate other forms of error check data as is known by those skilled in the art. The embedded bit error code further improves the bit error rate (BER) for the ID code signal. This operation is then repeated for all amplifier channels and streamed (e.g. transmitted) as the ID code signal. The ID code signal can then be combined with the clock signal and the frame signal by the MUX 316 to generate a frame plus ID plus clock hybrid signal that can be used as the synchronization signal SYNC2'. In this case, the SYNC modules 306-0 to 306-N−1 can be designed to use the frame signal for synchronization, and the SYNC modules 306-0 to 306-N−1 can be designed to detect the frame portion of the data streams. The frame signal can be used to synchronize PWM modulation within the amplifier channel modules 304-0 to 304-N−1 with a predetermined time offset that is detected by the SYNC modules 306-0 to 306-N−1. In particular, the frame signal is there to help set offsets used to synchronize processing by the class-D amplifier channel modules. In this case, a separate frame signal trace or wire is not required for the multi-channel class-D amplifier 300. One frame cycle completes the synchronization for the processing cycle of the amplifier channel modules 304-0 to 304-N−1 for a given frame of data.

The signal source 302 can be a simple analog interface that transfers the signal data and the synchronization information to the amplifier channel modules 304-0 to 304-N−1 when these modules accept analog inputs. When the signal source 302 can be designed to accept externally generated digital signals for INPUT-0 to INPUT-N−1, the amplifier channel modules 304-0 to 304-N−1 can be designed to process these signals.

Regardless of the format used for the synchronization signal SYNC2, each sync module 306-0 to 306-N−1 is equipped with a decoder to recognize the coded signal (i.e. pre-assigned ID) that is assigned to the corresponding class-D amplifier channel module 304-0 to 304-N−1. When a given sync module 306-X recognizes the occurrence of its assigned coded signal it generates a sync signal for its corresponding class-D amplifier channel module 304-X to process the corresponding input signal INPUT-X.

Figure 7D:
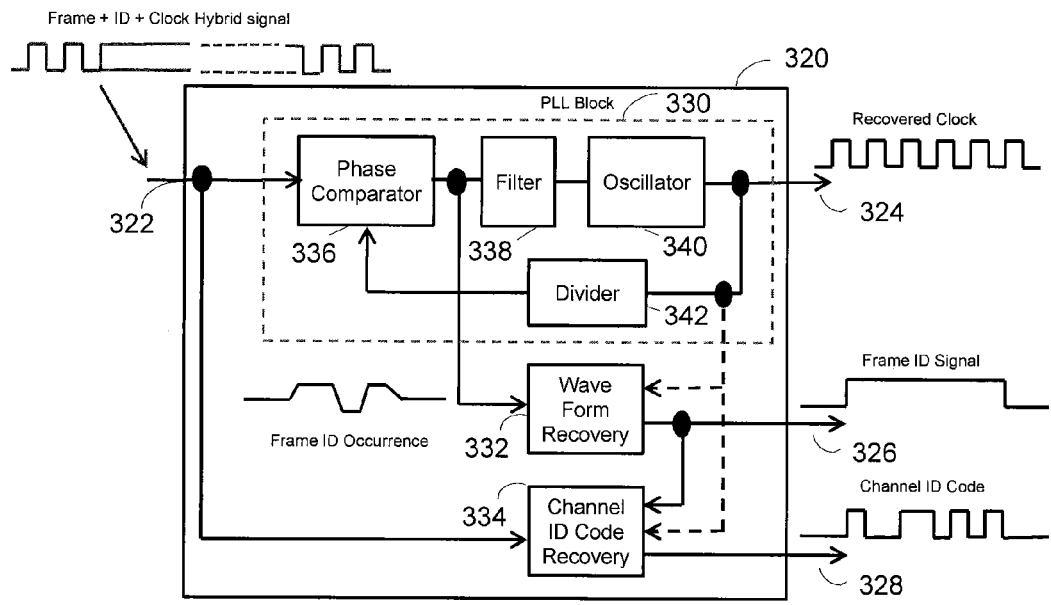
FIG. 7D is a block diagram of an example embodiment of a synchronization module that can be used with certain synchronization signals for the multi-channel class-D amplifier of FIG. 7A.
Figures 1, 7E:
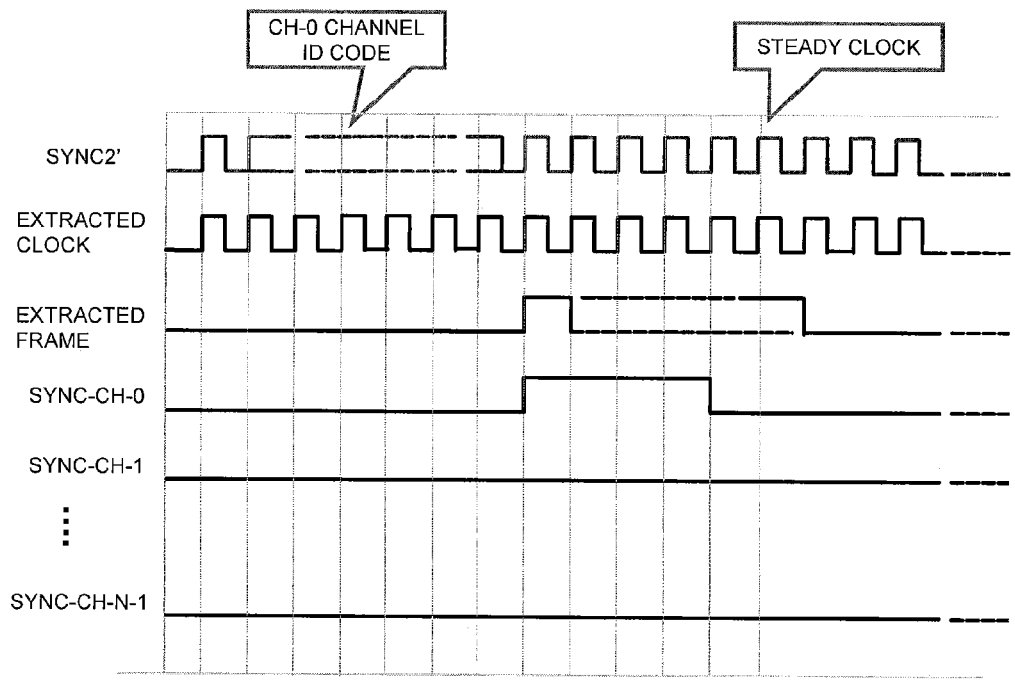
Figures 2, 7E:
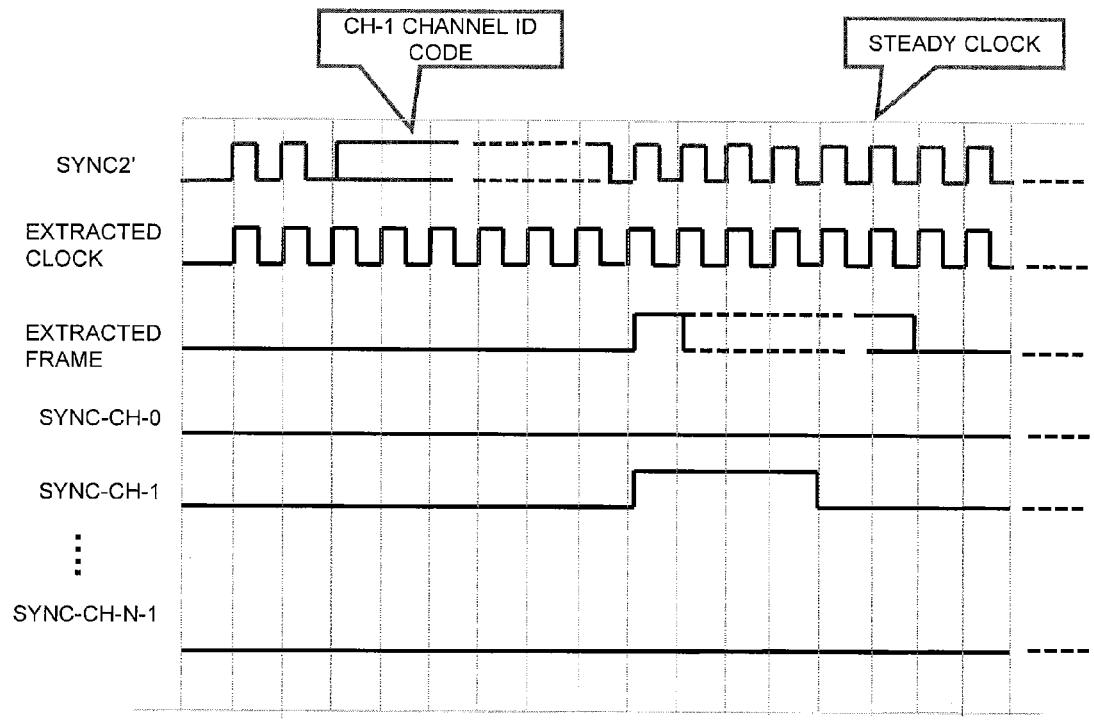
Figures 3, 7E:
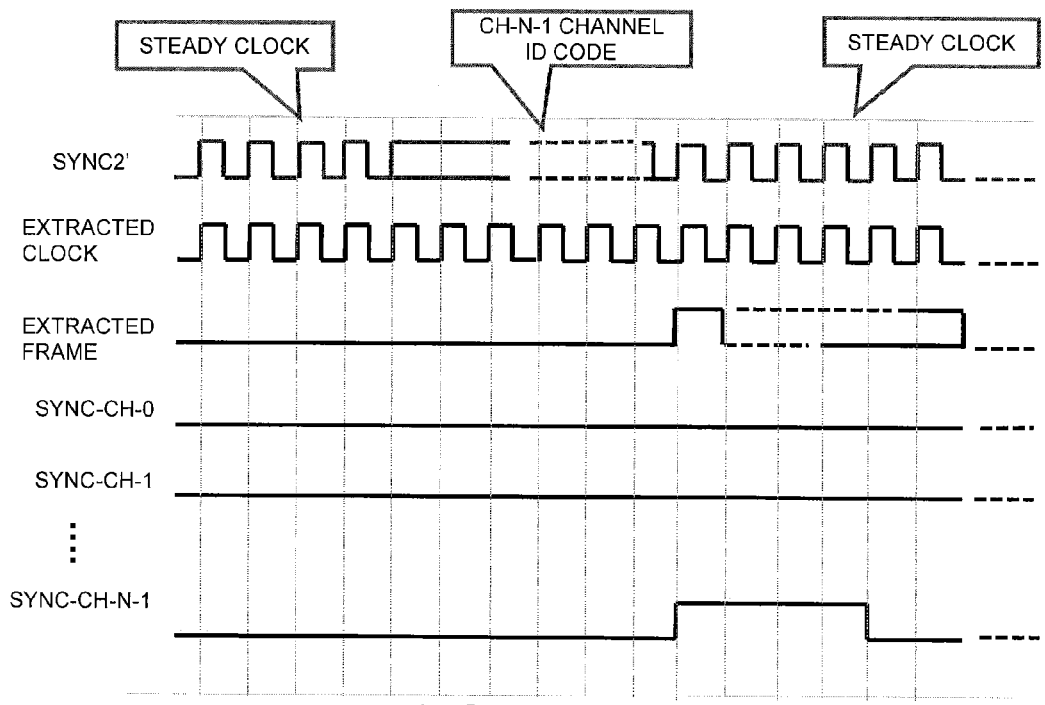

In one example embodiment, where the synchronization signal SYNC2' incorporates frame signals, channel ID codes and a clock signal, the sync modules 306-0 to 306-N−1 can be implemented using a decoder 320 which incorporates a Phase-Lock Loop (PLL)-based oscillator as shown in FIG. 7D. The decoder 320 has an input 322 to receive the coded synchronization signal SYNC2' and generates three outputs 324 to 328 including a recovered clock signal, a frame ID signal and a channel ID code signal 316 respectively. A given synchronization module would then use the recovered clock signal to time the PWM of the corresponding amplifier channel module, the frame ID signal to time when the amplifier channel module is to process its input and the channel ID code to determine if the recovered clock and the frame ID signal should be used by the corresponding amplifier channel module. The decoder 320 includes a PLL block 330 that generates the recovered clock signal, a waveform recovery block 332 that generates the frame ID signal and a channel ID code recovery block 334 that generates the channel ID code.

The PLL block 330 incorporates a phase comparator 336, a filter 338, an oscillator 340 and a divider 342. The filter 338 can be a band pass filter or a low pass filter with a pass band that depends on the implementation of the phase comparator and the frequency of the signal of interest. The divider 342 can also be used to generate different output frequencies if required and can create these output frequencies to be a fraction or multiple of its input frequency. The filter 338 extracts the clock frequency of the clock portion of the synchronization signal SYNC2' by ignoring the coded portions of the synchronization signal SYNC2' and locking onto the steady clock portion of the synchronization signal SYNC2'. The output of the phase comparator 336 allows for the derivation of the frame signal by the waveform recovery block 332, which can be implemented with a Low Pass Filter (LPF) or Running Average Filter (RAF) to ignore the short-time durations of drop-off and keep track of the general tendency of the frame ID signal. The channel ID code can be derived from a combination of the frame signal and the synchronization signal SYNC2' by the channel ID Code recovery block 334 which gates its input signal 322 (which is the synchronization signal SYNC2') by the re-generated frame ID signal. Therefore the output of the channel ID code recovery block 334 contains the channel ID code.

Referring now to FIGS. 7E-1, 7E-2 and 7E-3, shown therein is an example of the synchronization signal SYNC2', extracted clock and frame signals and the resulting synchronization signals that are used for each channel of the multi-channel class-D amplifier 300. The synchronization signal SYNC2' comprises a coded portion (for channel synchronization for each amplifier channel including a channel ID code and a frame signal) and a steady clock portion. The steady clock portion of the synchronization signal SYNC2' matches the extracted clock signal shown in FIGS. 7E-1, 7E-2 and 7E-3, which is essentially the signal that is used for the oscillators of each of the amplifier channel modules 304-0 to 304-N−1 of the multi-channel class-D amplifier 300. The extracted frame signal is used to indicate the beginning of the timing for the processing of channel data associated with a given amplifier channel. Accordingly, the rising edge of the frame after the identification of a channel code corresponds to the rising edge of one of the SYNC-CH-0 to SYNC-CH-N−1 signals. The signals labeled SYNC-CH-0 to SYNC-CH-N−1 represent the synchronization signals that are decoded from the coded portions of the coded synchronization signal SYNC2' and are used to time the processing of each amplifier channel module 304-0 to 304-N−1 of the multi-channel class-D amplifier 300. Each amplifier channel module 304-0 to 304-N−1 is therefore synchronized to operate after the occurrence of its corresponding channel ID code. Accordingly, it can be seen that the same oscillation frequency (signified by the clock signal) and different time offsets for processing are used for each channel 304-0 to 304-N−1 of the multi-channel class-D amplifier to reduce the generation of beat frequencies and to reduce peak power consumption by spreading the power consumption of the various channels out over time.

Figure 8A:
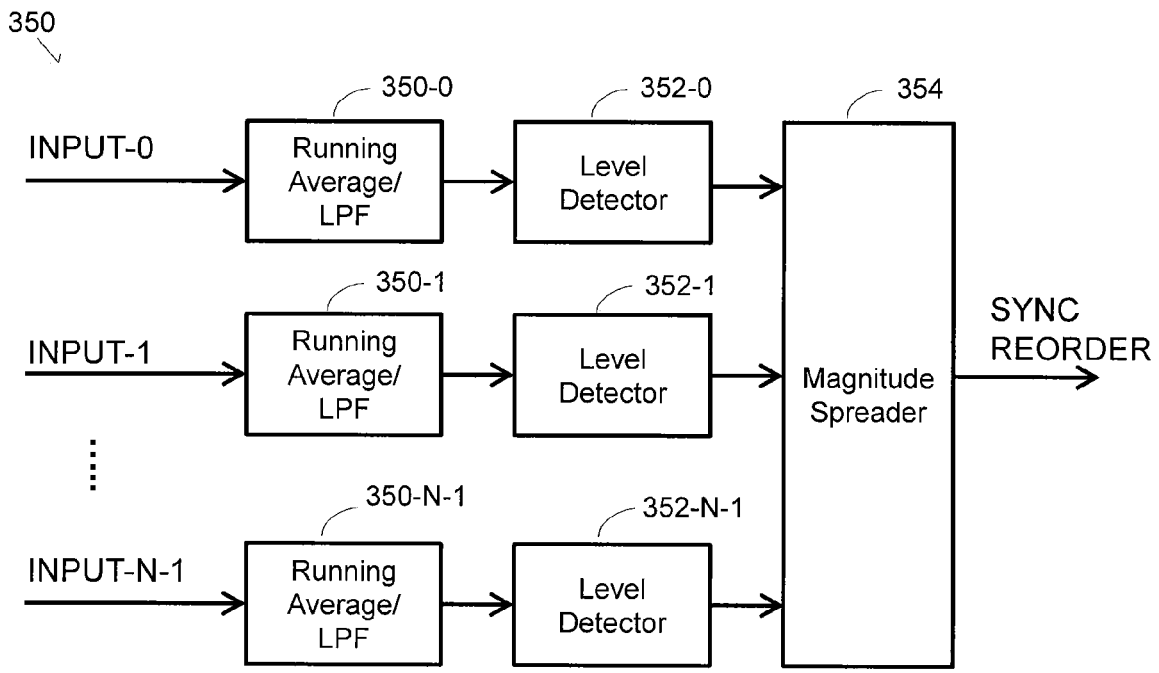
FIG. 8A is a block diagram of an example embodiment of a synchronization reorder block that can be used to reorder the synchronization signals based on input signal levels.

Referring now to FIG. 8A, shown therein is a block diagram of an example embodiment of a synchronization reorder block 350 that can be used to reorder the synchronization signals based on the levels of the input signals. This can be useful in situations where the input signals are at different levels or magnitudes. For instance, some of the input signals may have a high level while others may be at a low level for a significant time period. In these cases, it can be beneficial to reorder the processing of these signals to smooth out or reduce the peak power consumption of the multi-channel class-D amplifier. This can be done by reordering the offsets in the synchronization signals for the class-D amplifier channel modules are reordered based on levels of the input signals that are provided to the class-D amplifier channel modules rather than the numbering of the channels. For example in a 4 channel system, if the input signals for channels 0 and 1 are at a high level and the input signals for channels 2 and 3 are at a low level, the offsets for the corresponding synchronization signals can be adjusted so that pulses in the synchronization signals are arranged in time as SYNC-0, SYNC-2, SYNC-1, SYNC-3. Accordingly, the synchronization signals can be adjusted such that offsets for channels with high input signal levels are interspersed with offsets for channels with low signal levels. The rearranged synchronization timing does not affect the reproduction of the multi-channel audio output since the PWM processing frequency is very high relative to the frequencies in the audio output signal (this principle also applies to the other applications of the multi-channel class-D amplifiers).

The synchronization reorder block 350 includes running average blocks 350-0 to 350-N−1, level detector blocks 352-0 to 352-N−1 and magnitude spreader 354. Alternatively, the running average blocks 350-0 to 350-N−1 can be implemented with low pass filters. The running average blocks 350-0 to 350-N−1 filter the input signals INPUT-0 to INPUT-N−1 to remove spurious noise. The level detectors 352-0 to 352-N−1 then analyze the filtered input signals to determine the level of the filtered input signals. The magnitude spreader 354 then analyzes the levels of the input signals and rearranges the order of the input signals for the generation of the synchronization information (called SYNC reorder information) to reduce or smooth out the total power consumption. The SYNC reorder information is then sent to the ID code generator module 312. This particular embodiment of the synchronization reorder block 350 works with signal sources 252 and 302 but it can be altered to work with the other signal sources described herein. It should be noted that the processing of the synchronization reorder block 350 can be done with analog or digital circuitry, or a combination of both. Digital hardware or digital signal processing (DSP) can be used in case of digital solutions.

Figure 8B:
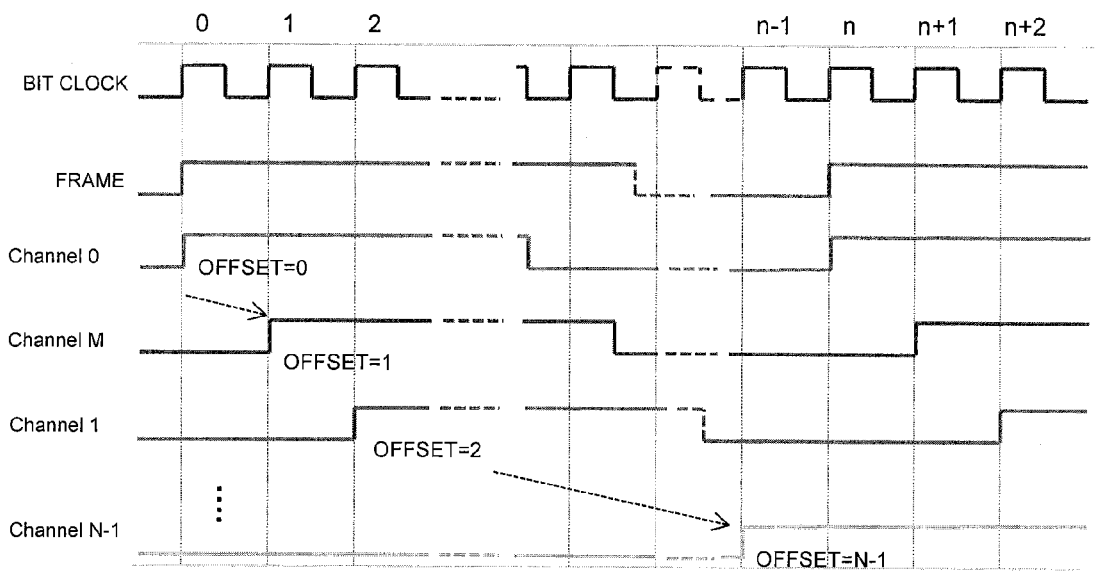
FIG. 8B shows an example of sync signals that can be reordered due to input signal level and used to synchronize channel processing for a multi-channel class-D amplifier.

Referring now to FIG. 8B, shown therein is an example of sync signals that can be reordered due to input signal level by the synchronization reorder block 350 and used to synchronize channel processing for a multi-channel class-D amplifier. In this case, the offset for channel M was adjusted so that it was between the offsets used for processing channels 0 and 1, which has the effect of reordering the processing of the channels so that the start of processing for channel M is after channel 0 but before channel 1.

There are many benefits or advantages for the various embodiments described herein. For example, the multi-channel class-D amplifier 150 of FIG. 4A is very effective from a cost-benefit point of view. In addition, the implementation of the multi-channel class-D amplifier 250 of FIG. 6A is favorable since it uses the least number of traces.

The various embodiments described herein are also flexible in terms of implementation depending on the intended application. For example, for audio applications, the signal sources 152, 202, 252 and 302 can be implemented using either hardware or software. Any applications that utilize frequencies that are higher than the audio band can be implemented using hardware. For motor control applications, the functionality of the signal source 152 can be implemented using Digital Signal Processing (DSP) software. In addition, the various channel amplifier modules can be implemented using hardware to keep costs down. Furthermore, the various embodiments described herein can be used in applications at low frequencies (e.g. motor control) as well as applications at high frequencies on the order of several hundreds of kHz (e.g. large LED display applications).

The various embodiments described herein can also be used in applications that vary quite widely in form factor. In particular, applications of some of the embodiments described herein can vary from small portable electronic devices, such as handheld devices held or carried by the human hand for example, to very large applications, such as large LED display signs for example. For example, for small form-factor applications, such as handheld devices, the multi-channel class-D amplifier 150 of FIG. 4A or the multi-channel class-D amplifier 300 of FIG. 7A can be used.

In one aspect, in at least one example embodiment described herein, there is provided a multi-channel class-D amplifier comprising a signal source that provides a plurality of input signals and generates synchronization information; and a plurality of class-D amplifier channel modules, each class-D amplifier channel module being configured to process a corresponding input signal from the plurality of input signals according to the synchronization information to produce a corresponding output signal. The synchronization information comprises information for switching frequencies and processing offsets wherein the switching frequencies employed by the plurality of class-D amplifier channel modules are substantially similar to one another and the processing of the plurality of input signals is offset in time across the plurality of class-D amplifier channel modules.

In at least some embodiments, the synchronization information comprises a plurality of synchronization signals having pulses that are offset with respect to one another in time and each of the synchronization signals is sent to a unique class-D amplifier channel module to offset the processing of each class-D amplifier channel module in time.

In at least some embodiments, the amount of offset for a given class-D amplifier channel module corresponds to a channel identifier of the given class-D amplifier channel module.

In at least some embodiments, the offsets in the synchronization information for the class-D amplifier channel modules are reordered based on levels of the input signals provided to the class-D amplifier channel modules.

In at least some embodiments, the class-D amplifier channel modules comprise synchronization modules configured to synchronize the processing of the class-D amplifier channel modules according to the synchronization information.

In at least some embodiments, the synchronization information comprises a clock signal and a frame signal, and wherein upon a rising edge in the frame signal, the synchronization modules are configured to identify a corresponding pulse in the clock signal that indicates that the class-D amplifier channel module that corresponds to the synchronization module is to start processing the corresponding input signal.

In at least some embodiments, the synchronization modules are configured to identify the corresponding pulse by counting the number of pulses in the clock signal after the rising edge in the frame signal.

In at least some embodiments, the synchronization information comprises a coded synchronization signal having coded portions and wherein the synchronization modules are configured to identify a corresponding coded portion in the coded synchronization signal that indicates that the class-D amplifier channel module that corresponds to the synchronization module is to start processing the corresponding input signal.

In at least some embodiments, the coded synchronization signal further comprises a series of clock pulses that follow the coded portions, and wherein the clock pulses are used to ensure substantially similar switching for each of the class-D amplifier channel modules.

In at least some embodiments, the coded synchronization signal further comprises frame signals to set offsets used to synchronize processing by the class-D amplifier channel modules.

In at least some embodiments, the coded portions of the coded synchronization signal comprise quasi-random signals.

In at least some embodiments, the coded portions of the coded synchronization signal are produced using M series random coding and each synchronization module comprises a phase-lock loop based oscillator to identify the coded portion associated with a particular M series random code.

In another aspect, in at least one example embodiment described herein, there is provided a method of processing a plurality of input signals for a multi-channel class-D amplifier comprising a plurality of class-D amplifier channel modules. The method comprises generating synchronization information; providing each class-D amplifier channel module with a corresponding input signal from the plurality of input signals and the synchronization information; employing switching frequencies for each class-D amplifier channel module; and processing the corresponding input signals at each of the class-D amplifier channel modules according to the synchronization information to produce corresponding output signals. The synchronization information comprises information for the switching frequencies and processing offsets wherein switching frequencies are substantially similar to one another and the processing of the plurality of input signals is offset in time across the plurality of class-D amplifier channel modules.

In at least some embodiments, the synchronization information comprises a clock signal and a frame signal, and wherein upon a rising edge in the frame signal, the method comprises identifying a corresponding pulse in the clock signal that indicates that a corresponding class-D amplifier channel module is to start processing the corresponding input signal.

In at least some embodiments, the method comprises identifying the corresponding pulse by counting the number of pulses in the clock signal after the rising edge in the frame signal.

In at least some embodiments, the synchronization information comprises a coded synchronization signal having coded portions and wherein the method further comprises identifying a corresponding coded portion in the coded synchronization signal that indicates that a corresponding class-D amplifier channel module is to start processing the corresponding input signal.

In at least some embodiments, the coded portions of the coded synchronization signal are produced using M series random coding and the method comprises using a phase-lock loop based oscillator to identify the coded portion associated with a particular M series random code.

It should be understood that various modifications can be made to the embodiments described and illustrated herein, without departing from the embodiments, the general scope of which is defined in the appended claims. For example, it should be noted that while the processing of the class-D amplifier channels in the various embodiments described herein have been described as starting on a rising edge of a pulse in a given synchronization signal, any of these embodiments can instead utilize the negative edge of a pulse in a given synchronization signal. The latter can be achieved by reversing the corresponding logic circuitry used in the various embodiments described herein. It should also be noted that generally the amount of time offset between the processing in each of the channels of the multi-channel class-D amplifiers described herein is relatively small and its effect on the output signals can effectively be ignored (if the effect does become noticeable then a timing offset can be applied to the input signal source to reduce this effect). For example, with an input signal at a frequency of 1 KHz, a clock frequency of 8 MHz and an 8 channel system (i.e. N=8), the offset for each channel can be set to 1 clock period of the 8 MHz clock signal. The largest offset would then be between the first channel and the last channel which is 8 MHz/8=1 MHz=1 psec, which is 1,000 times shorter than the signal of interest at 1 KHz.

The invention claimed is:

1. A multi-channel class-D amplifier comprising:
a signal source that provides a plurality of input signals and generates synchronization information, the synchronization information comprising information for switching frequencies, processing offsets and a coded synchronization signal comprising coded portions; and
a plurality of class-D amplifier channel modules, each class-D amplifier channel module of the plurality of class-D amplifier channel modules being configured to process a corresponding input signal from the plurality of input signals to produce a corresponding output signal, each class-D amplifier channel module of the plurality of class-D amplifier channel modules comprising a synchronization module configured to recognize an occurrence of its assigned coded signal and upon recognition generate a sync signal for a corresponding class-D amplifier channel module to process a corresponding input signal,
wherein the switching frequencies employed by the plurality of class-D amplifier channel modules are substantially similar to one another and the processing of the plurality of input signals is offset in time across the plurality of class-D amplifier channel modules according to the processing offsets.

2. The amplifier of claim 1, wherein the synchronization information comprises a plurality of synchronization signals having pulses that are offset with respect to one another in time and each of the synchronization signals is sent to a unique class-D amplifier channel module to offset the processing of each class-D amplifier channel module in time.

3. The amplifier of claim 2, wherein an amount of processing offset for a given class-D amplifier channel module corresponds to a channel identifier of the given class-D amplifier channel module.

4. The amplifier of claim 2, wherein offsets in the synchronization information for the class-D amplifier channel modules are reordered by a synchronization reorder block based on levels of the input signals provided to the class-D amplifier channel modules.

5. The amplifier of claim 1, wherein the coded synchronization signal further comprises a series of clock pulses that follow the coded portions, and wherein the clock pulses are used to ensure substantially similar switching for each of the class-D amplifier channel modules.

6. The amplifier of claim 5, wherein the coded synchronization signal further comprises frame signals to set offsets used to synchronize processing by the class-D amplifier channel modules.

7. The amplifier of claim 1, wherein the coded portions of the coded synchronization signal comprise quasi-random signals.

8. The amplifier of claim 1, wherein the coded portions of the coded synchronization signal are produced using M series random coding and each synchronization module comprises a phase-lock loop based oscillator to identify the coded portion associated with a particular M series random code.

9. A method of processing a plurality of input signals for a multi-channel class-D amplifier comprising a plurality of class-D amplifier channel modules, wherein the method comprises:

generating synchronization information comprising information for switching frequencies, processing offsets and a coded synchronization signal comprising coded portions;
providing each class-D amplifier channel module of the plurality of class-D amplifier channel modules with a corresponding input signal from the plurality of input signals and the synchronization information;
employing switching frequencies for each class-D amplifier channel module of the plurality of class-D amplifier channel modules;
generating a sync signal for a corresponding class-D amplifier channel module of the plurality of class-D amplifier channel modules upon recognition of the occurrence of an assigned coded signal; and
processing the corresponding input signals at each of the class-D amplifier channel modules of the plurality of class-D amplifier channel modules according to the synch signal to produce corresponding output signals, wherein the switching frequencies are substantially similar to one another and the processing of the plurality of input signals is offset in time across the plurality of class-D amplifier channel modules according to the processing offsets.

10. The method of claim 9, wherein the synchronization information comprises a plurality of synchronization signals having pulses that are offset with respect to one another in time and each of the synchronization signals is sent to a unique class-D amplifier channel module to offset the processing of each class-D amplifier channel module in time.

11. The method of claim 10, wherein an amount of processing offset for a given class-D amplifier channel module corresponds to a channel identifier of the given class-D amplifier channel module.

12. The method of claim 10, wherein offsets in the synchronization information for the class-D amplifier channel modules are reordered based on levels of the input signals provided to the class-D amplifier channel modules.

13. The method of claim 10, wherein the coded synchronization signal further comprises a series of clock pulses that follow the coded portions, and the clock pulses are used to ensure substantially similar switching for each of the class-D amplifier channel modules.

14. The method of claim 13, wherein the coded synchronization signal further comprises frame signals to set offsets used to synchronize processing by the class-D amplifier channel modules.

15. The method of claim 10, wherein the coded portions of the coded synchronization signal comprise quasi-random signals.

16. The method of claim 10, wherein the coded portions of the coded synchronization signal are produced using M series random coding and the method comprises using a phase-lock loop based oscillator to identify the coded portion associated with a particular M series random code.

17. A multi-channel class-D amplifier comprising:
a signal source that provides a plurality of input signals and generates synchronization information; and
a plurality of class-D amplifier channel modules, each class-D amplifier channel module of the plurality of class-D amplifier channel modules having a synchronization module that is configured to synchronize processing a corresponding input signal from the plurality of input signals according to the synchronization information to produce a corresponding output signal,
wherein the synchronization information comprises information for switching frequencies and processing offsets and a coded synchronization signal having coded portions,
wherein the synchronization modules are configured to identify a corresponding coded portion in the coded synchronization signal that indicates that the class-D amplifier channel module that corresponds to the synchronization module is to start processing the corresponding input signal,
wherein the coded portions of the coded synchronization signal are produced using M series random coding and each synchronization module comprises a phase-lock loop based oscillator to identify the coded portion associated with a particular M series random code, and
wherein the switching frequencies employed by the plurality of class-D amplifier channel modules are substantially similar to one another and the processing of the plurality of input signals is offset in time across the plurality of class-D amplifier channel modules.

18. A method of processing a plurality of input signals for a multi-channel class-D amplifier comprising a plurality of class-D amplifier channel modules, wherein the method comprises:
generating synchronization information comprising information for switching frequencies and processing offsets and a coded synchronization signal having coded portions that are produced using M series random coding;
providing each class-D amplifier channel module of the plurality of class-D amplifier channel modules with a corresponding input signal from the plurality of input signals and the synchronization information;
using a phase-lock loop based oscillator to identify the coded portion associated with a particular M series random code in the coded synchronization signal that indicates that a corresponding class-D amplifier channel module is to start processing the corresponding input signal;
employing switching frequencies specified in the synchronization information for each class-D amplifier channel module of the plurality of class-D amplifier channel modules; and
processing the corresponding input signals at each of the class-D amplifier channel modules according to the synchronization information to produce corresponding output signals,
wherein the switching frequencies are substantially similar to one another and the processing of the plurality of input signals is offset in time across the plurality of class-D amplifier channel modules.

* * * * *